United States Patent [19]
Liao

[11] Patent Number: 6,115,444
[45] Date of Patent: Sep. 5, 2000

[54] ENERGY CONSERVING COUNTER USING TERMINAL COUNT VALUE AND METHOD THEREFOR

[75] Inventor: William Liao, Santa Clara, Calif.

[73] Assignee: Amphus, Inc., San Jose, Calif.

[21] Appl. No.: 09/248,917

[22] Filed: Feb. 11, 1999

[51] Int. Cl.[7] .................................................. G06F 7/02
[52] U.S. Cl. .............................. 377/111; 377/33; 377/114; 340/146.2
[58] Field of Search .............................. 377/33, 111, 114; 340/146.2

[56] References Cited

U.S. PATENT DOCUMENTS 5,689,228  11/1997  Yetter et al. ........................... 340/146.2
5,821,850  10/1998  Beck ..................................... 340/146.2

*Primary Examiner*—Margaret R. Wambach
*Attorney, Agent, or Firm*—Flehr Hohbach Test Albritton & Herbert LLP

[57] ABSTRACT

Structure and method for counting a predetermined number of counts is provided. A count end value is identified which is greater than or equal to (not less than) the predetermined number of counts. The count end value is chosen such that it is representable by n symbols (designated $n-1, n-2, \ldots, m, m-1, \ldots, 1, 0$) where the most significant $n-1$ through $m$ symbols are a first binary symbol and the least significant $m-1$ through $0$ symbols are a different second binary symbol, for example "1"0 and "0". An n-symbol current count value (also representable by $n-1, n-2, \ldots, m, m-1, \ldots, 1, 0$ symbols) is initialized to a count start value which is equal to the count end value minus the predetermined number of counts, then as the counter counts, the current count value is incremented by one (or some other count increment) for each count or cycle of the counter. After each iteration (or before the next iteration of the counter cycle) each of the $n-1, \ldots, m$ symbols are compared with the first binary symbol. If the $n-1, \ldots, m$ symbols match, a count completed indicator is generated signifying that the desired count has been reached. Due to the manner in which the count values are chosen, it is not necessary to examine or compare the other $m-1, \ldots, 0$ symbols. A counter structure, including an electronic counter, a mechanical counter, and a method for designing a counter are also provided.

9 Claims, 19 Drawing Sheets

Figure 4

| Example | Requirements | Typical Count Start Value | Typical Count End Value | New Count Start Value | New Count End Value |
|---|---|---|---|---|---|
| 1 | Fixed TERM_CNT equal to 136 (10001000) | 0 (00000000) | 136 (10001000) | 56 (00111000) | 192 (11000000) |
| 2 | Fixed TERM_CNT equal to 150 (10010110) | 0 (00000000) | 150 (10010110) | 42 (00101010) | 192 (11000000) |
| 3 | Variable TERM_CNT from 48 (000110000) to 346 (101011010) | 0 (00000000) | From 48 (000110000) up to 346 (101011010) | From 336 (101010000) down to 38 (000100110) | 384 (110000000) |

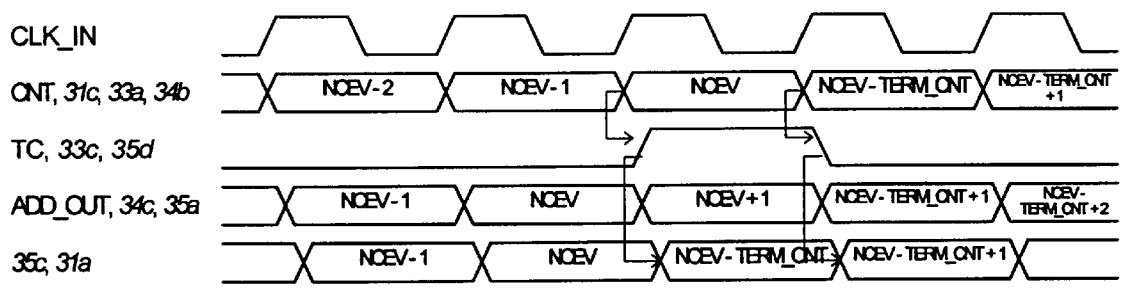

Figure 9

| Power consumed by | Supplied by | Counter 10 label | Counter 30 label |
|---|---|---|---|
| • Adder B input capacitance<br>• comparator A input capacitance<br>• capacitance of wire to adder B input, comparator A input, and CNT | Q output of flip-flop array | $P_{11c}$ | $P_{31c}$ |
| • D1 input of multiplexer<br>• capacitance of wires to D1 | D output of subtractor | n/a | $P_{32c}$ |
| • S input of multiplexer<br>• capacitance of wire to S | Y output of comparator | $P_{13c}$ | $P_{33c}$ |
| • D0 input of multiplexer<br>• capacitance of wires to D0 | S of adder | $P_{14c}$ | $P_{34c}$ |
| • flip-flop D input capacitance<br>• D input wire capacitance | Y of mux | $P_{15c}$ | $P_{35c}$ |
| • flip-flop clock input capacitance<br>• clock wire capacitance | CLK_IN | $P_{CLK\_10}$ | $P_{CLK\_30}$ |
| • subtractor B Input capacitance<br>• wire capacitance to B input of subtractor | TERM_CNT | n/a | $P_{TCNT\_30}$ |
| • Comparator B input capacitance<br>• wire capacitance to comparator B input | TERM_CNT | $P_{TCNT\_10}$ | n/a |
| • Power consumed by internal signals of flip-flop array | - | $P_{11}$ | $P_{31}$ |
| • Power consumed by internal signals of subtractor | - | n/a | $P_{32}$ |
| • Power consumed by internal signals of comparator | - | $P_{13}$ | $P_{33}$ |
| • Power consumed by internal signals of adder | - | $P_{14}$ | $P_{34}$ |
| • Power consumed by internal signals of multiplexer | - | $P_{15}$ | $P_{35}$ |

Figure 10

| | Counter 10 | $CNT_{10}[m:0]$ | | Counter 30 | $CNT_{30}[m:0]$ |
|---|---|---|---|---|---|
| | | | E1 | $(2^m -$ $TERM\_CNT[m:0])$ : $2^m - 1$ | 0??...? : 011...1 |
| A1 | 0 : $2^m$ | 000...0 : 100...0 | E2 | $2^m - 1$ $2^m$ | 011...1 100...0 |
| A2 | $2^m$ : $(2^{m+1}-1)$ | 100...0 : 111...1 | F1 | $2^m$ : $(2^{m+1}-1)$ | 100...0 : 111...1 |
| A3 | $(2^{m+1}-1)$ 0 | 111...1 000...0 | F2 | $(2^{m+1}-1)$ 0 | 111...1 000...0 |
| B1 | 0 : $2^m$ | 000...0 : 100...0 | F3 | 0 : $2^m$ | 000...0 : 100...0 |
| B2 | $2^m$ : $(2^{m+1}-1)$ | 100...0 : 111...1 | G1 | $2^m$ : $(2^{m+1}-1)$ | 100...0 : 111...1 |
| B3 | $(2^{m+1}-1)$ 0 | 111...1 000...0 | G2 | $(2^{m+1}-1)$ 0 | 111...1 000...0 |
| C1 | 0 : $2^m$ | 000...0 : 100...0 | G3 | 0 : $2^m$ | 000...0 : 100...0 |
| C2 | $2^m$ : $(2^{m+1}-1)$ | 100...0 : 111...1 | H1 | $2^m$ : $(2^{m+1}-1)$ | 100...0 : 111...1 |
| C3 | $(2^{m+1}-1)$ 0 | 111...1 000...0 | H2 | $(2^{m+1}-1)$ 0 | 111...1 000...0 |
| D1 | 0 : $TERM\_CNT[m:0]-1$ | 000...0 : 0??...? | H3 | 0 : $2^m$ | 000...0 : 100...0 |
| D2 | $TERM\_CNT[m:0]-1$ $TERM\_CNT[m:0]$ | 0??...? 0??...? | I1 | $2^m$ $(2^m -$ $TERM\_CNT[m:0])$ | 100...0 0??...? |
| D3 | $TERM\_CNT[m:0]$ 0 | 0??...? 000...0 | I2 | | |

Figure 11

| Counter 10 | $CNT_{10}[m:0]$ | Counter 30 | $CNT_{30}[m:0]$ |
|---|---|---|---|
| 0 | 0000 | $(2^m-1)=7$ | 0111 |
| 1 | 0001 | $(2^m-2)=6$ | 0110 |
| 2 | 0010 | $(2^m-3)=5$ | 0101 |
| 3 | 0011 | $(2^m-4)=4$ | 0100 |
| $(TERM\_CNT[m:0]-1)=4$ | 0100 | $(2^m-TERM\_CNT[m:0])=3$ | 0011 |

Figure 12

| n | TERM_CNT | T | 2m | 2m/T (%) |
|---|---|---|---|---|
| 3 | 5<br>(101) | 10 | 2 | 20.0 |
| 4 | 9<br>(1001) | 18 | 4 | 22.2 |
| 5 | 17<br>(10001) | 34 | 6 | 17.6 |
| 6 | 33<br>(100001) | 66 | 8 | 12.1 |
| 7 | 65<br>(1000001) | 130 | 10 | 7.7 |
| 8 | 129<br>(10000001) | 258 | 12 | 4.6 |

Figure 13

| Example | Requirements | Typical Count Start Value | Typical Count End Value | New Count Start Value | New Count End Value |
|---|---|---|---|---|---|
| 4 | TC starts when CNT is 173 (10101101), stops when CNT is equal to a programmable number between 175 (10101111) and 180 (10110100) | 0 (00000000) | From 175 (10101111) up to 180 (10110100) | 19 (00010011) | From 194 (11000010) up to 199 (11000111) |

ENERGY CONSERVING COUNTER USING TERMINAL COUNT VALUE AND METHOD THEREFOR

FIELD OF INVENTION

This invention pertains generally to the field of digital counter circuits and more particularly to the field of fast digital counter circuits having a reduced number of gates and low power consumption.

BACKGROUND OF THE INVENTION

Counters are conventionally used in virtually every digital circuit design and implementation. In such conventional counter circuits, when the counter count reaches a target value, a terminal count output is typically generated. This terminal count output is then used to trigger other events in the digital circuit.

We now identify certain notational conventions that will be used to describe conventional counter structure and method as well as the inventive counter structure and method in subsequent sections of this disclosure. For an n-bit wide signal or signal value, the most significant bit is the bit designated as bit (n−1), and the least significant bit is the bit designated bit 0. We note that in general, a signal can have different values at different times. The term "name [index]" refers to bit number index of the signal identified as name, so that for example, we refer to "trigger[3]" as bit 3 of the trigger signal. The term "name [index1:index2]" represents all bits from bit number index1 to bit number index2 inclusive of the signal called "name".

A conventional counting procedure 100 and the steps a conventional counter such as counter 10 in FIG. 2, executes is now described relative to the diagrammatic flow-chart in FIG. 1 and the digital circuit diagram in FIG. 2. In Step 101, an n-bit wide flip-flop array 11 within counter 10 waits for an active clock input signal (CLK_IN) edge. When the clock edge is detected, the counter output signal CNT generated at the Q output of flip-flop array 11 is set to 0 if the terminal count output TC is 1 (Step 102), and otherwise CNT is set to ADD_OUT (Step 104), where ADD_OUT is the output generated by n-bit adder 14. Terminal count output TC is generated from TERM_CNT and CNT in counter 10, and will be zero ("0") when TERM_CNT and CNT are not equal, and one ("1") when TERM_CNT is equal to CNT.

In Step 105, CNT is compared in the n-bit wide comparator 13 with the terminal count value TERM_CNT. The terminal count value TERM_CNT is generated, computed, stored in a register, or otherwise provided to counter 10. Individual bits of TERM_CNT may alternatively be hard wired to particular "1" or "0" logic levels or voltages representing these logic states. When TERM_CNT is equal to CNT, TC is set to 1 (Step 106); when they are not equal, TC remains 0 (Step 107). Finally in Step 108, the adder 14 output signal ADD_OUT is set to the value of CNT incremented by one value (CNT+1), and the method 100 begins again waiting for an active clock edge (Step 101). From this description of a conventional digital counter, it is clear that the comparisons are n-bit wide bit-by-bit comparisons.

We now describe a typical conventional digital logic circuit implementation of the method in FIG. 1 relative to counter 10 in FIG. 2. This implementation is especially common in ASIC or cell-based design environment, because all of the counter 10 components are readily available in cell libraries, and because it can be clearly described to synthesis tools in Hardware Design Language (HDL). Counter 10 consists of one n-bit wide comparator 13 which performs steps 105, 106, and 107; one n-bit wide flip-flop array 11 and one n-bit wide 2-to-1 multiplexer 15. Comparator 13, flip-flop array 11, and multiplexer 15 together carry out steps 101, 102, 103, and 104. Counter 10 also includes an n-bit adder 14 which performs the addition procedure in Step 108. The variable n is determined by the width of the terminal count value TERM_CNT, that is by the number of bits required to represent the terminal count value. Of course a greater number of bits may be used than the number actually required.

At the rising edge of every clock CLK_IN 11b (Step 101), the D input 11a of flip-flop array 11 is transferred to its Q output 11c (Step 103 or Step 104). Q output 11c is connected to the count output CNT. Q output 11c is also connected to input 14a of adder 14, whose second input 14b is coupled to the structure storing or repesenting constant 1. Note that in this description, reference to a register storing a variable, parameter, constant, or the like is understood to mean not only a storage register, but also any other means for representing that value, such as for example, representing that value by actually storing the value in a register, memory, or other storage means, connecting it to a predetermined voltage level representing a logic value, connecting it to a circuit that generates the logic value, or the like implementations. In the case of a constant 1 for example, the second input 14b may be connected or hard-wired to a voltage representing logic value "1". Adder output 14c, which during normal operation within the operating range of the counter, is always one greater than Q output 11c (Step 108), is connected to the Data0 (D0) input 15a of the multiplexer 15. (It may be noted that once the design limit of the counter is reached, for example at a count of 15 in a 4-bit counter, then the adder output 14c may not be greater than the Q output 11c, but we generally don't care about the adder output 14c once the counter output reaches its maximum count, in this case at a count of 15.) The Data1 (D1) input 15b of the multiplexer is wired to a register or logic element storing or representing the constant 0, hardwired to a voltage level representing logic level "0". It may also be noted that typically, constants are usually hard-wired rather than stored in a register or other storage means.

The flip-flop array Q output 11c is also fed to comparator 13 through the "A" input 13a. This comparator compares the "A" input (flip-flop Q output) 13a with the target count TERM_CNT value 13b. When input 13a is not equal to the "B" comparator input 13b, the comparator output 13c is 0; when they are equal, comparator output 13c (terminal count output TC), becomes 1 (Steps 105, 106, and 107).

In addition to signaling the terminal count, comparator output 13c also provides a control (input select) signal to multiplexer 15 through its select input at terminal 15d. When terminal 15d is logic 0, the multiplexer passes the input appearing at terminal 15a to its Y output terminal 15c (Steps 102 and 103). When select terminal 15d is logic 1, the signal at terminal 15b is passed through multiplexer 15 and appears at the Y output terminal 15c (Steps 102 and 104) as the MUX_OUT signal. Since multiplexer output terminal 15c is connected to flip-flip array 11 "D" input 11a, at the next rising clock edge, counter 10 will either be reset to 0 if TC is 1, or continue to count toward the next count if TC is 0.

The timing diagram showing the relationships between and among the CLK_IN, CNT, TC, ADD_OUT, and MUX_OUT signals of the operation of conventional counter 10 is shown in FIG. 3. This timing diagram covers a period surrounding the assertion of TC.

As describe previously earlier, all counter 10 components in FIG. 2 are n-bit wide, and the particular value of n is determined by the value of TERM_CNT. The reason for the width requirement is that the all components must be at least as wide as the greatest possible TERM_CNT. For example, if the range of TERM_CNT is from 13 to 137, then all components must be at least 8-bit wide in order to represent 137, because at some point CNT will be equal to TERM_CNT, as shown in FIGS. 1 and 2. Recall that decimal 137 is binary 10001001 requiring 8 bits. The counter output signal (CNT) will require 8 bits for proper representation when CNT reaches and is equal to TERM_CNT. This means all counter 10 components must be 8-bit wide to handle 8-bit quantities. (Although wider components can be used, they are not needed and will only consume area and power.)

BRIEF DESCRIPTION OF THE DRAWINGS

FIG. 4 shows a chart of exemplary parameters used in the description of exemplary inventive counter structures and methods.

FIG. 8 shows a timing diagram for selected signals of the counter circuit in FIG. 7 around the activation of TC.

FIG. 9 shows a chart identifying circuits, connectors, and nodes where power may be consumed and provides a basis for comparing power consumption in the conventional counter and inventive counters of FIGS. 2 and 7.

FIG. 10 is an illustration showing a comparison of bit toggle occurrences between a typical conventional counter and an embodiment of the inventive counter.

FIG. 11 is an illustration showing the comparisons of count toggles between a typical conventional counter and an embodiment of the inventive counter.

FIG. 12 shows a chart listing values parameters as a function of bit width n and other parameters used in power consumption computations.

FIG. 13 shows a chart of a second set of exemplary parameters used in the description of exemplary alternative inventive counter structures and methods.

SUMMARY OF THE INVENTION

Figure 1:
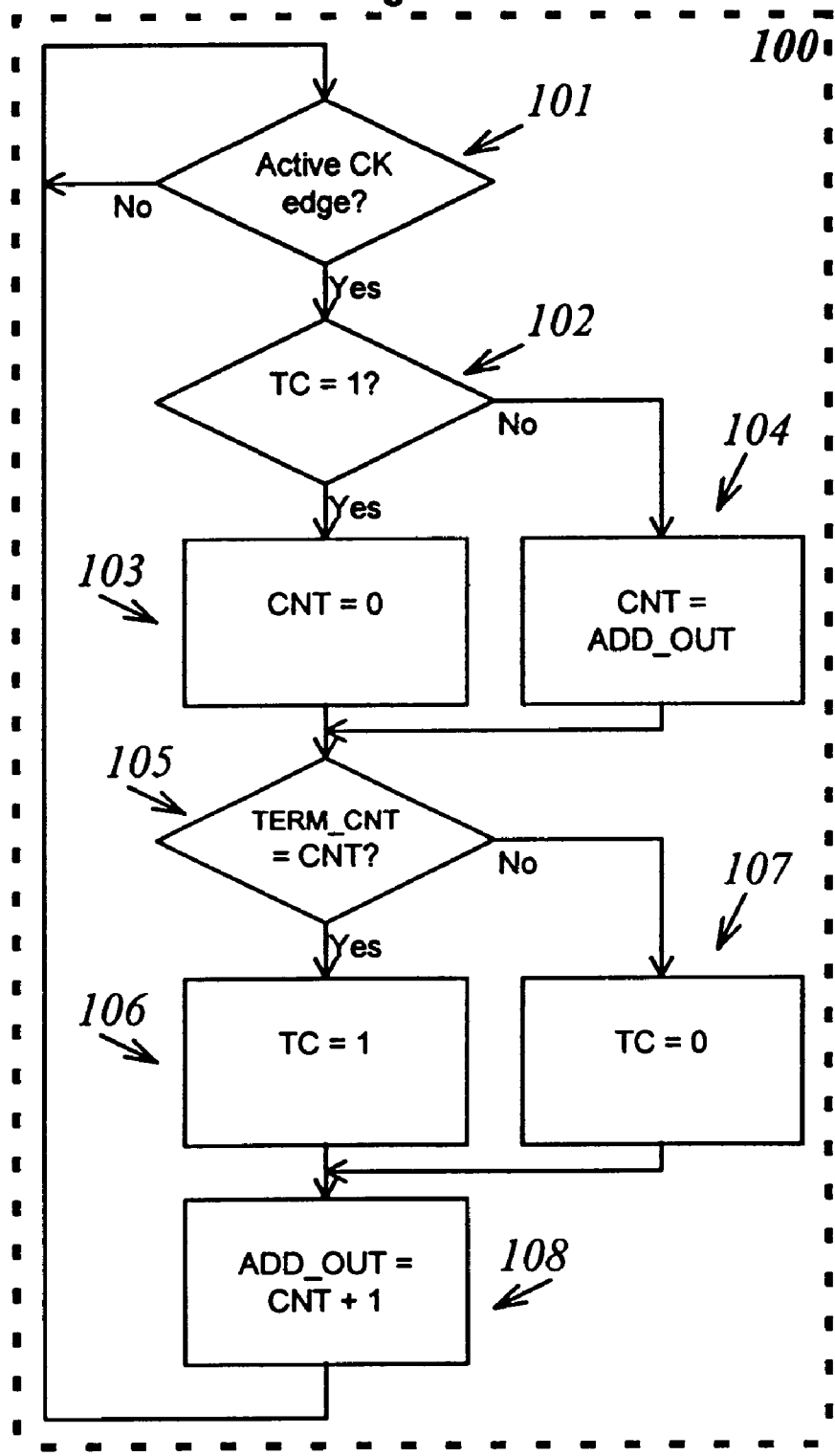
FIG. 1 shows a diagrammatic flow chart illustration of a conventional digital counter counting procedure.

The invention includes a counter circuit structure, a method for counting, and a method for designing a counter. The inventive structure and method modify the range over which the counter counts so that the operating range reduces the number or frequency of changes in symbols representing the count. This reduction in symbol change or symbol toggle reduces the energy required to operate the counter, whether in an electronic device, computer, or mechanical counter or clock. In electronic circuits particularly, the inventive structure and method provide for smaller circuits (smaller silicon area), higher operating frequencies, and lower power consumption that of conventional structures and methods.

In one embodiment, a method for counting a predetermined number of counts is provided. A count end value is identified which is greater than or equal to (not less than) the predetermined number of counts. The count end value is chosen such that it is representable by n symbols (designated n−1, n−2, . . . , m, m−1, . . . , 1, 0) where the most significant n−1 through m symbols are a first binary symbol and the least significant m−1 through 0 symbols are a different second binary symbol, for example "1" and "0". An n-symbol current count value (also representable by n−1, n−2, . . . , m, m−1, . . . , 1, 0 symbols) is initialized to a count start value which is equal to the count end value minus the predetermined number of counts, then as the counter counts, the current count value is incremented by one (or some other count increment) for each count or cycle of the counter. After each iteration (or before the next iteration of the counter cycle) each of the n−1, . . . , m symbols are compared with the first binary symbol. If the n−1, . . . , m symbols match, a count completed indicator is generated signifying that the desired count has been reached. Due to the manner in which the count values are chosen, it is not necessary to examine or compare the other m−1, . . . , 0 symbols. A counter structure, including an electronic counter, a mechanical counter, and a method for designing a counter are also provided.

DETAILED DESCRIPTION OF THE EMBODIMENTS

The invention is a counter circuit structure, a method for counting, and a method for designing a counter. A central idea embodied by the inventive structure and method is to move, shift, or slide the range covered (counted) by the counter upwards to a value that is selected to provide advantageous structural and methodological characteristics. The advantages provided by this inventive structure and method for sliding-the-range include smaller circuits (smaller silicon area), higher operating frequencies, and lower power consumption than of conventional structures and methods.

In FIG. 4, there is shown a table which identifies three example situations in which the counter range is slid or shifted upwards from a first or lower value to a higher value. In Example 1, the conventional counter would require a terminal count (TERM_CNT) of decimal 136 (10001000 binary) using 8-bits, and would count from zero (00000000) to 136 (10001000). Using the count range slide procedure, the new count start value is decimal 56 (00111000) and the new count end value is 192 (11000000). The difference in the end and start count values remains 136 counts.

Similarly, in Example 2, there is a requirement for an effective terminal count or count range of decimal 150

(10010110) which is implemented using the inventive structure and method using a new count start value of 42 (00001010) and a new count end value of 192 (11000000). The counter still counts a difference of 150 counts. It is not coincidental that the end count value here and in Example 1 are identically 192.

Finally, Example 3 provides flexibility to implement a variable TERM_CNT value in the range between 48 (000110000)and 346 (101011010) using 9-bits. In this example, the start count value is shifted from zero (00000000) to a value in the range between 336 (101010000) and 38 (000100110) and the typical end count value is shifted from the range between 48 (000110000) and 346 (101011010) to the new count end value of 384 (110000000).

In the above Examples 1 and 2 a fixed TERM_CNT is provided that can be wired into the comparator portion of the counter. In Example 3, a variable TERM_CNT is provided, which may require a general purpose comparator if implemented using a flip-flop array 11.

We first describe one embodiment of the inventive method, then describe exemplary structures which may be used to implement the invention and describe additional embodiments of the inventive method relative to the structures. In a first embodiment, a method for counting a predetermined number of counts is provided. A count end value is identified which is greater than or equal to (not less than) the predetermined number of counts. The count end value is chosen such that it is representable by n symbols (designated n−1, n−2, ..., m, m−1, ..., 1, 0) where the most significant n−1 through m symbols are a first binary symbol and the least significant m−1 through 0 symbols are a different second binary symbol, for example "1" and "0". An n-symbol current count value (also representable by n−1, n−2, ..., m, m−1, ..., 1, 0 symbols) is initialized to a count start value which is equal to the count end value minus the predetermined number of counts, then as the counter counts, the current count value is incremented by one (or some other count increment) for each count or cycle of the counter. After each iteration (or before the next iteration of the counter cycle) each of the n−1, ..., m symbols are compared with the first binary symbol. If the n−1, ..., m symbols match, a count completed indicator is generated signifying that the desired count has been reached. Due to the manner in which the count values are chosen, it is not necessary to examine or compare the other m−1, ..., 0 symbols.

The manner in which the count is slid or shifted is now described relative to several embodiments of the inventive structure and method. An embodiment of the inventive method 400 for counting is now described relative to the flow chart diagram in FIG. 5. The exemplary method is illustrated diagrammatically in flow chart 400 differs from the conventional counting method 100 illustrated and described relative to FIG. 1 in at least three ways. These differences involve procedures or Steps 403, 405, and 409 and their relationships to the other steps. First, inventive Step 409 is a new step that requires the designer to determine the new count end value (NCEV), which will be discussed shortly. Second, Step 403 (compare to conventional Step 103) the counter is set to (NCEV−TERM_CNT) instead of 0. Finally, in Step 405, (compare to Step 105 counterpart) CNT is compared against NCEV instead of TERM_CNT in the conventional method.

There is one other important difference between conventional counting structure 10 and method 100 and the inventive counting structure (See, for example counter embodiment 30 in FIG. 7) method 400. Counter 10, constructed to perform method 100, may be used to count all values of TERM_CNT with substantially the same utility so long as there are a sufficient number of bits to represent the desired TERM_CNT. By comparison, a counter constructed to execute the inventive method 400, although still working correctly for all values of TERM_CNT, may not be the most suitable choice for a counting structure or method in all situations. For example, when all bits of TERM_CNT are "1", or when TERM_CNT is fixed at a value equal to NCEV, where NCEV is found according to steps in the procedure shown and described below, then the inventive counter structure and method may loose some of the advantages over the conventional structure and method.

The new count end value (NCEV) is typically a constant for a specific counter design, but must be large enough to support the largest expected terminal count that will be used. Once its value is determined, it will generally be fixed into the counter hardware design and counting procedure. One procedure by which an appropriate value of NCEV may be determined is now described, but those workers having ordinary skill in the art will appreciate in light of the disclosure provided here, that the new count end value (NCEV may be determined by other procedures that the one described here.

In one embodiment of the invention the new count end value (NCEV is determined, for example by the procedure described below. First, the maximum count (TERM_$CNT_{max}$) the counter will need to count to is identified. This is the greatest possible value taken on by TERM_CNT in the counter. For example, in the scenario described relative to Example 2 in FIG. 4, TERM_$CNT_{max}$ will be the number 150; while for the scenario in Example 3, the value of TERM_$CNT_{max}$ is the number 346. Next, we determine the bit width n required to represent TERM_$CNT_{max}$, where in general n=⌊$\log_2$ TERM_$CNT_{max}$⌋+1. Eight bits would be required to represent 150, while nine bits would be required to represent the value 346. Then we determine the a temporary variable (m) according to the equation:

$$m=\lfloor \log_2 (2^n-\text{TERM-CNT}_{max})\rfloor;$$

where the notation "⌊x⌋" refers to the "floor of x", that is the largest integer value not greater than x. If any bits of TERM_$CNT_{max}$[m−1:0] are "1", then TERM_$CNT_{max}$[m] is the most significant "0" bit; otherwise, TERM_$CNT_{max}$[m] is the least significant 1 bit, and the NCEV determined according to the procedure described immediately below will be equal to TERM_$CNT_{max}$.

The new count end value (NCEV) can be found by calculating the summation:

$$NCEV = \sum_{i=m}^{n-1} 2^i,$$

where n is the bit-width of TERM_$CNT_{max}$, i is a summation temporary index, and m is the temporary variable defined earlier representing the mth bit position. The value calculated for NCEV will be as many bits wide as is TERM_$CNT_{max}$, and will be no less than the value of TERM_$CNT_{max}$ since we shift NCEV toward a larger value. Furthermore, the bit positions n−1 through m (NCEV [n−1:m]) are all "1" bits while the bit positions m−1 through bit position zero (NCEV[m−1:0]) are all "0" bits. For example, a decimal NCEV value is "224", and has an 8-bit binary representation of"11100000", where NCEV[n−1:m]

is binary "111" and NCEV[m−1:0] is binary "00000". We now consider an exemplary numerical calculation for a decimal "150" count or the 8-bit binary "10010110" TERM_CNT$_{max}$, for which NCEV=192 as follows:

$$NCEV = \sum_{i=m}^{n-1} 2^i = \sum_{i=6}^{g-1} 2^i = 2^6 + 2^7 = 64 + 128 = 192$$

where the decimal value "192" has a corresponding binary representation of "11000000". We note that the binary bit string "10010110" has its most significant "0" bit at bit position "6", where the lowest significant bit is bit position zero.

Figure 5:
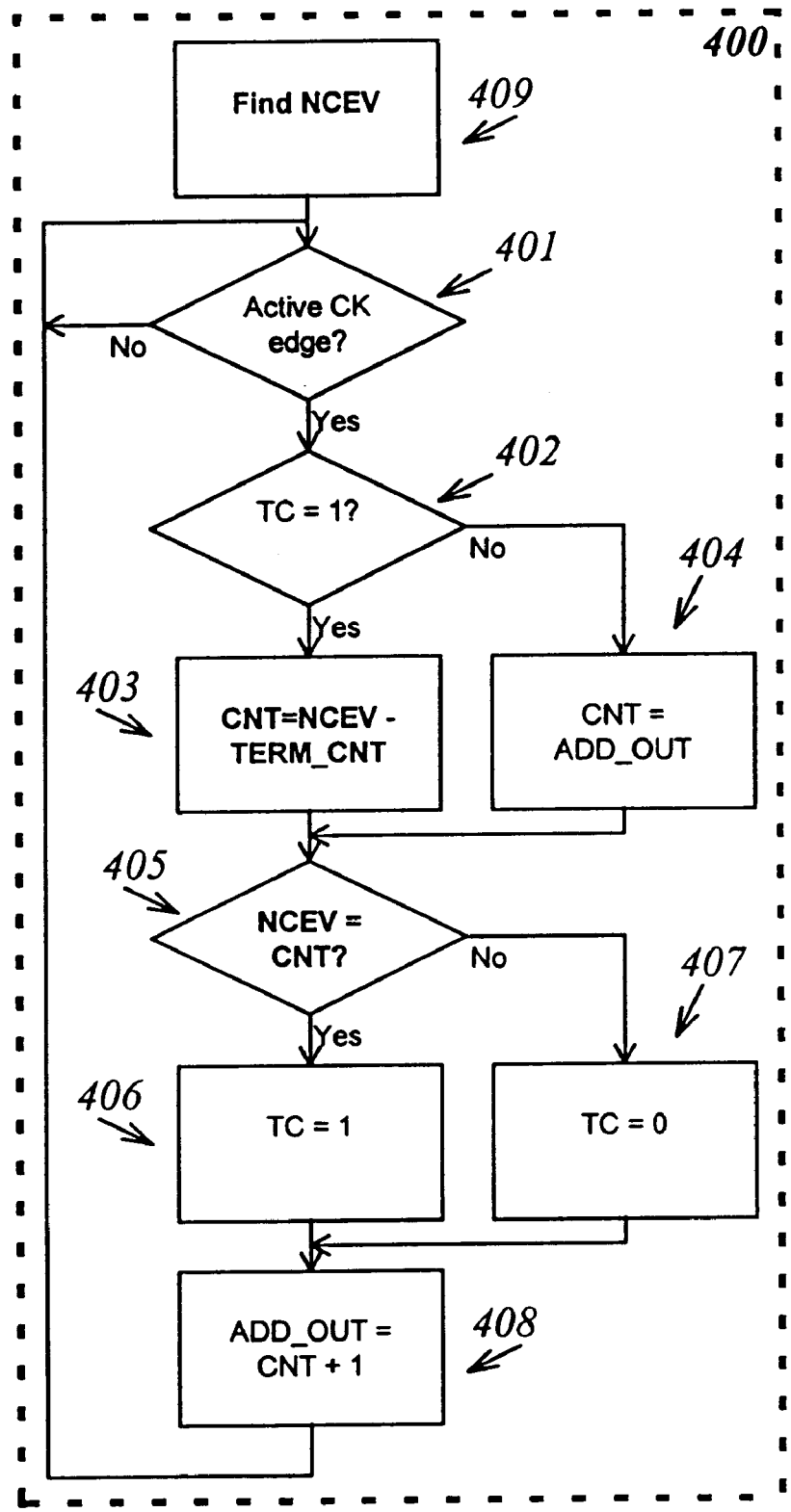
FIG. 5 shows a diagrammatic flow chart illustration of an exemplary embodiment of the digital counter counting procedure.

One particular embodiment of the inventive procedure is now described relative to the diagrammatic flow-chart in FIG. 5. We first note certain similarities between the flow-chart representation of the conventional counting method in FIG. 1 and the exemplary embodiment of the inventive method in FIG. 5; later the differences will be explained. Step 103 is replaced by Step 403 wherein CNT is set to the value of NCEV−TERM_CNT, and Step 105 is replaced by Step 405 wherein a comparison is made as to whether NCEV is equal to CNT. In Step 409, some procedure for determining the value of NCEV is performed; however, the NCEV determination step is a separate procedure from the counting procedure, and although one particular procedure is described elsewhere in this description, the inventive counting procedure may use other procedures to determine NCEV. The other steps, or functional blocks in the flow-chart FIG. 5 diagram are functionally similar at a high-level to those in conventional counters, but the particular structure and the detailed steps involved with the particular inventive implementation and the inventive structure are advantageously different from the structure used to implement the conventional counting method. These structural and procedural differences have significant benefits for reducing power consumption in each counter circuit.

With these differences in mind, we now describe an embodiment of the inventive counting method 400 relative to the flow-chart in FIG. 5. In Step 401, an n-bit wide flip-flop array 31 within counter 30 (See FIG. 7) waits for an active clock input signal (CLK_IN) edge. When the clock edge is detected, the counter output signal CNT generated at the Q output of flip-flop array 31 is set to a value equal to NCEV−TERM_CNT if the terminal count output TC is 1 (Step 403), and otherwise CNT is set to ADD_OUT (Step 404), where ADD_OUT is the output generated by n-bit adder 34. In Step 403, the resultant CNT is generated from the difference in NCEV from TERM_CNT in subtractor 32. In Step 405, CNT (after propagating through multiplexer 31 and flip-flop array 31) is compared in comparator 33 with NCEV. When NCEV is equal to CNT, TC is set to 1 (Step 406); when they are not equal, TC remains 0 (Step 407). Finally in Step 408, the adder 34 output signal ADD_OUT is set to the value of CNT incremented by one value (CNT+1), and the method 400 iterates and begins again waiting for an active clock edge (Step 401). Once determined, the value for NCEV (Step 409) need not be recomputed each iteration.

From the flow chart of FIG. 5 it should be clear that the counter count (CNT) should never be larger than the new end count value (NCEV), as when CNT reaches NCEV, the counter resets itself. Since only the most significant (n−m) bits of NCEV are "1", the comparison operation between NCEV and CNT comprises comparing or verifying that the most significant (n−m) bits of CNT are all "1". That is, when CNT[n−1], CNT[n−2], CNT[n−3], . . . , CNT[m+2], CNT[m+1], CNT[m], are all logical "1" then NCEV is equal to CNT. The comparison procedure (generally Steps 405, 406, and 407) can be implemented using a simple comparator adapted to this procedure, such as the multi-input "AND" gate 33 shown in the exemplary embodiment of a comparator circuit in FIG. 6.

Figure 7:
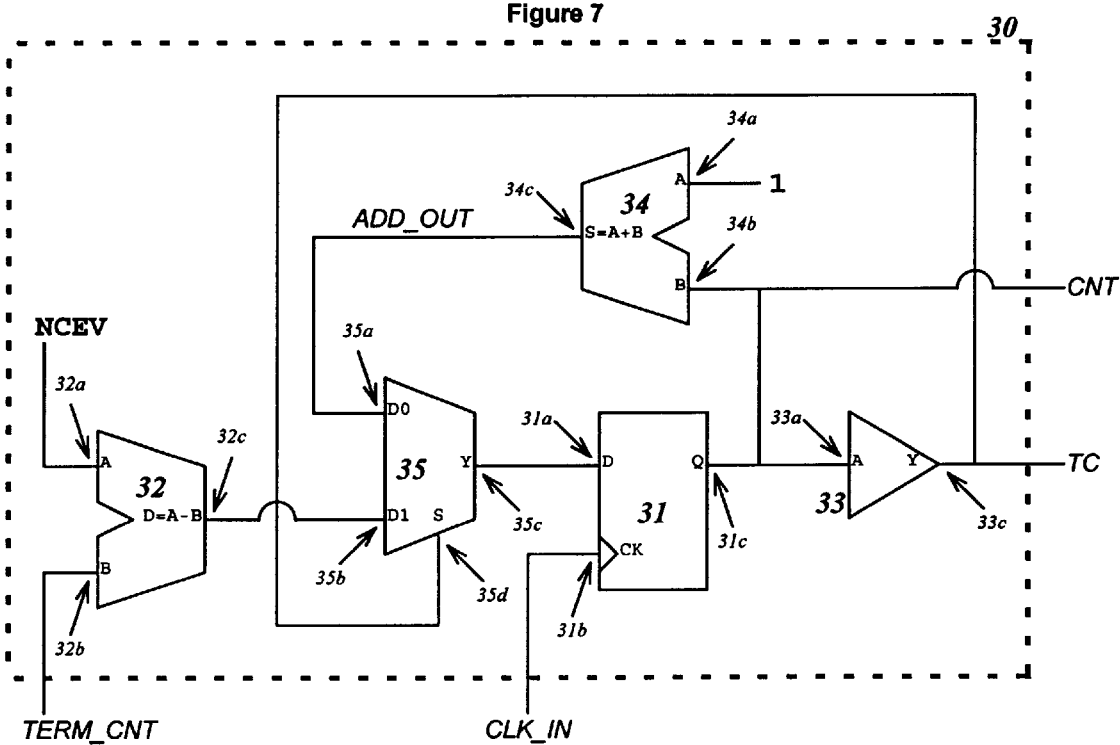
FIG. 7 shows an embodiment of the inventive digital counter circuit suitable for implementing embodiments of the inventive counting procedure.

An exemplary inventive counter structure is illustrated and described relative to the embodiment in FIG. 7. Those workers having ordinary skill in the art in light of description provided herein will realize that there are many possible counter designs that utilize the invention, and that the embodiment in FIG. 7 is merely provided by way of example, and that many possible counter structures may be implemented according to the present invention. The change in the count start value from 0 to (NCEV−TERM_CNT) requires the addition of one subtractor 32 in counter 30 which was not present in counter 10. Recall that in the subtraction operation, the remainder is equal to the minuend minus the subtrahend (r=m−s). Subtractor 32 receives a first input NCEV(minuend) at its "A" input (32a) and a second input TERM_CNT (subtrahend) at its "B" input (32b) and generates the remainder NCEV−TERM_CNT at its "D" output (32c). The remainder output is coupled to the "D1" input port 35b of multiplexer 35. By way of comparison conventional counter 10, the subtractor 32 output remainder replaces the constant 0 at the "D1" input of the multiplexer 15.

Figure 2:
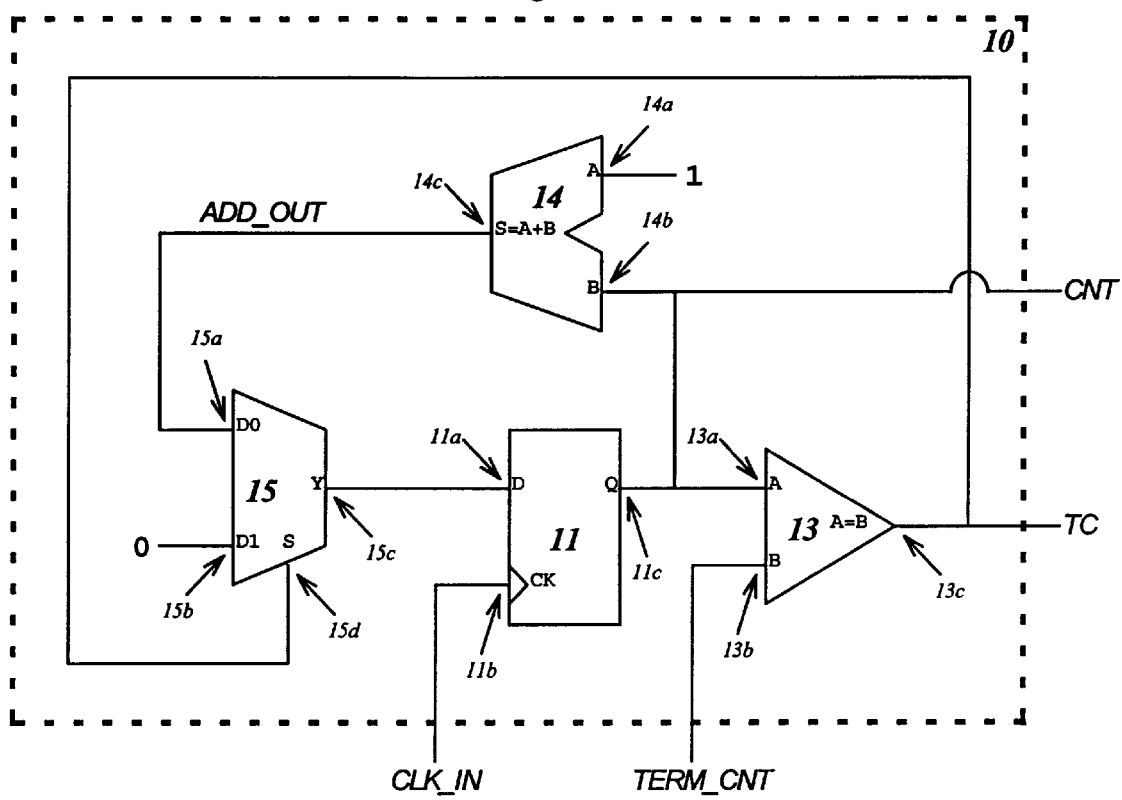
FIG. 2 shows a typical conventional digital counter circuit implementing the counting procedure of FIG. 1.
Figure 3:
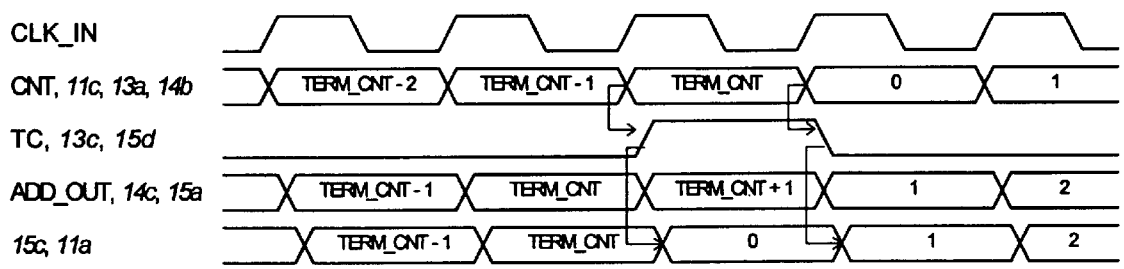
FIG. 3 shows a timing diagram for selected signals of the counter circuit in FIG. 2 around the activation of TC.
Figure 6:
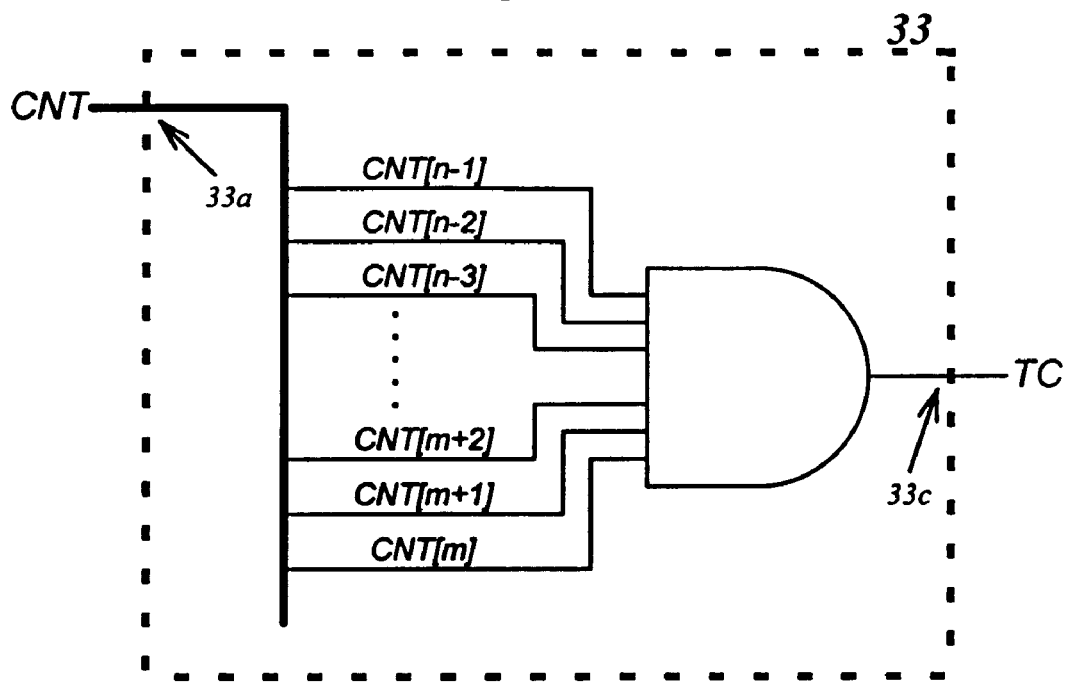
FIG. 6 shows an exemplary multi-input logic AND gate that may be used as a comparator in the inventive circuit of FIG. 7.

In the inventive counter 30, flip-flop array 31, adder 34, and multiplexer 35 correspond to flip-flop array 11, adder 14, and multiplexer 15 in conventional counter 10 (See FIG. 1). Each of these structures supports n-bits. Subtractor 32 is added to counter 30 to calculate the difference between NCEV and TERM_CNT as described. The "comparator" 33 may readily be implemented using a multi-input "AND" logic gate as shown in FIG. 6, and is much simpler and more power conservative than comparator 13 of counter 10. Other elements of counter 30 are analogous in structure and function to corresponding elements of counter 10. We note that the bit-widths in each of the components, except for bit-width of the comparator, in FIG. 2 and FIG. 7 are the same. In the inventive structure and method, the comparator may be narrower than the comparator required in a conventional counter because in the inventive courter, only a some of the bits need to be checked and therefore the comparator may have fewer bits. Some of the power or energy savings derive from the narrower comparator structure.

The timing diagram for counter 30 showing the relationships between and among the CLK_IN, CNT, TC, ADD_OUT, and MUX_OUT signals of the operation of conventional counter 30 is shown in FIG. 8. This timing diagram covers a period surrounding the assertion of TC.

We have described one structure for conventional counter and an exemplary embodiment of a counter implemented according to the present invention. We have also described structural, functional, and methodological differences between conventional counters and the inventive counter, and stated that the inventive structure and method provide for a reduction in power or energy consumption as compared to conventional structures without sacrificing performance. While the reduction in power consumption should be readily apparent from the description of the inventive structure and method, we now describe some qualitative and quantitative comparisons between the expected power consumption of embodiments of the inventive structure in comparison with the conventional structure and method. These comparisons are provided so that an appreciation of the manner of energy and power reduction will be appreciated, however, the particular power savings are by way of example and are not to be interpreted as limiting the invention.

The power consumption of conventional counter 10 and the exemplary embodiment of inventive counter 30 are now compared to illustrate this advantage relative to certain power consumption parameters summarized in the diagram of FIG. 9, which identifies where and how power is consumed by the internal components of an exemplary conventional counter 10 and the exemplary embodiment of inventive counter 30 in a side-by-side comparison table. In the table of FIG. 9, the labels $P_X$ refer to the power consumed by (or at) component x (terminal x) of each counter. For example, $P_{11c}$ refers to the power consumed at terminal 11c of flip-flop array 11 in counter 10. The numerical values in the chart and in this discussion assume that the same design principles are applied to both counter 10 and counter 30 implementations, but the principles of this invention are not limited to any particular circuitry implementation. In fact any technology where an energy savings is derived by reducing the number of "toggles" will result in a power or energy savings. For example, it should be clear that every savings are to be realized by reducing the number of toggles of switching devices, such as transistors fabricated as integrated circuits or otherwise, but in addition mechanical counters having mechanical elements that move or toggle in response to a count will also use less energy if the number of moving parts, or the number of times one or more moving parts is required to move, is reduced. Therefore, the invention is also applicable to mechanical counting devices and methods. For example, mechanical clocks may benefit from the inventive structure and method.

Note that because the input values to the "A" inputs of Subtractor 32 and Adder 34 (in counter 30) and Adder 14 (in counter 10) are constant (logic 1 and hard-wired NCEV) and do not toggle between states, the capacitances to these "A" input nodes do not appear in the chart of FIG. 9 because they have either no effect or substantially no effect on power consumption. Also note that the external load capacitance on CNT and TC are not included in the table. They are outside the scope of this discussion, because they are influenced by many factors external to the counters.

In the descriptive power analysis that is presented below, the following notational conventions are observed. The parameter n denotes the counter width, (equal to the width of TERM_CNT), and the notation TERM_CNT[m] refers to the most significant "0" bit of TERM_CNT.

The number of toggles a bit makes during counting is important in terms of how much power is consumed by the counter. We define a "toggle" to occur when a single bit signal makes a transition from logic "1" to logic "0" or from logic "0" to logic "1", or when any bit of a multi-bit signal changes logic level ("0" to "1" or "1" to "0").

To confine this analysis of power consumption to reasonable scope so that the advantages provided by the inventive structure and method may be readily appreciated, six simplifying assumptions have been made. These assumptions are for the purpose of performing the energy consumption comparison and do not limit the scope or applicability of the inventive structure or method.

Assumption 1; The new count end value, NCEV, is never equal to TERM_CNT, and not all bits of TERM_CNT are 1. As mentioned earlier, counter 30 does not necessarily provide advantages over the conventional counter 10 in this situation. If this assumption is not true, the inventive counter 30 will still operate however the advantages over the conventional counter may be small or none existent. For example, if the terminal count (TERM_CNT) for a conventional counter is already set to decimal "192", then there may be no advantage. These particular TERM_CNT values may neutralize the advantages of counter 30, while requiring a counter structure that is the same size or larger than counter 10, for example as a result of the added subtractor 32 not needed in counter 10. On the other hand, if TERM_CNT is programmable, and most TERM_CNT values can benefit from the inventive structure and method, then counter 30 may still be used in preference to counter 10.

Assumption 2: The bit width of TERM_CNT is sufficiently wide so that power savings are achieved by reducing a sufficient number of bit toggles as compared to energy that may be consumed by the additional structures in counter 30, not present in the conventional counter 10.

Assumption 3; The same fabrication and circuit technology is used in both the conventional and inventive counter designs, meaning that the layout, cell design, capacitance per unit wire, and many other technology related factors are the same or roughly the same.

Assumption 4: The applications for the counters are the same or roughly same, so that the operating frequency and other conditions are equivalent.

Assumption 5: The terminal count value input TERM_CNT does not change after the design so that the counter structure may be optimized for the intended terminal count. This is a reasonable assumption, since in many designs this number is in fact hard-wired into the counter design, and in many other applications this input is programmable but is initialized only during reset.

Assumption 6: The power consumed is about proportional to toggle rate or load so that power consumption is reduced as the toggle rate or load is reduced. This is a common simplification in CMOS design and follows from the equation for power consumption (P) in a CMOS circuit: $P=kCV^2f$, where C is capacitance, V is the voltage, and f is frequency, and k is a constant, typically equal to about ½.

Assumption 7: The value of TERM_CNT is some predetermined value and is not arbitrarily programmable to any selected value. This last assumption (also applicable to assumptions 2–6) is only desirable so that the analysis may be reduced to a manageable level and the underlying power or energy savings understood without obscuration.

It is emphasized that these assumptions are made for the purpose of simplifying the power or energy conservation analysis and do not limit the conditions underwhich the inventive structure and method may be used.

Several results follow directly from the structures shown for the exemplary counter 30 and counter 10 and from these assumptions. We refer to the chart in FIG. 9 for the definitions of the terms. The difference between $P_{CLK\_10}$ and $P_{CLK\_30}$, that is the difference in the flip-flop clock input capacitance and clock wire capacitance between counter 10 and counter 30 should be negligible as the circuits in this area are the same. Assumption 3 ensures the load seen by CLK_IN are about the same in both designs, and assumption 4 ensures that the counters have the same operating frequency. Thus from assumption 6, it follows that the power consumed at this node in each counter must be approximately equal.

The next comparison pertains to the TERM_CNT signals. Under assumption 5, it is clear that the frequency, f, for TERM_CNT is 0, or nearly 0, for both counters. Therefore, the power consumed by subtractor 32 ($P_{32}$), counter 10 comparator 13 B terminal input capacitance and wire capacitance to B input of comparator 13 ($P_{TCNT\_10}$), and the counter 30 subtractor 32 B terminal input capacitance and wire capacitance to B terminal of subtractor 32 ($P_{TCNT\_30}$), and the power consumed by counter 30 multiplexer 35 D1 terminal input capacitance and wire capacitance to this terminal ($P_{32c}$) should be negligible.

Under Assumptions 3 and 4, $P_{13c}$ and $P_{33c}$ (See FIG. 9 for definitions) should be approximately the same. All other power consuming components are directly or indirectly affected by the toggle rates of CNT. For example, the more often CNT toggles, the higher $P_{11}$ and $P_{14}$ will be. For purposes of explaining the manner in which CNT is affected by the inventive method, the CNT bits are conveniently partitioned into two non-overlapping groups, the high-order bits (CNT[n−1:m+1]) and the low-order bits (CNT[m:0]); and each group is analyzed immediately below. In the description to follow and for purposes of clarity of description, we distinguish the various counts of counter 10 by the subscript 10 (e.g. $CNT_{10}$[m:0]) or the counts of counter 30 by the subscript 30 (e.g. $CNT_{30}$[m:0])

High-Order CNT Signal Bits (CNT[n−1:m+])

In counter 10, $CNT_{10}$ starts from 0 (where all bits are "0") and ends at TERM_CNT. As described hereinbefore, TERM_CNT[n−1:m+1] are all "1", so $CNT_{10}$[n−1:m+1] starts from all "0" and ends at all "1", or the value of $CNT_{10}$[n−1:m+1] is equal to $2^{n-m-1}-1$. In counter 30, $CNT_{30}$ starts from (NCEV−TERM_CNT) and ends at NCEV. From the formula for calculating $$NCEV = \sum_{i=m}^{n-1} 2^i$$

described previously, it is clear that NCEV[n−1:m] are all "1". Since all bits of TERM_CNT[n−1:m+1] and NCEV [n−1:m+1] are "1", it follows that TERM_CNT[m] is "0", NCEV[m] is "1", and bits n−1 through m+1 of (NCEV−TERM_CNT) must be all "0". This means $CNT_{30}$[n−1:m+1] starts from 0 and ends at $2^{n-m-1}-1$, just like $CNT_{10}$. Noting that $CNT_{10}$[n−1:m+1] and $CNT_{30}$[n−1:m+1] count through the same range and hence the same number of bit toggles, there should be no difference in the power consumption between the two counters as a result of the number of bit toggles.

Low Order CNT Signal Bits (CNT[m:0])

In conventional counter 10, the low-order CNT bits repeatedly count from 0 to ($2^{m+1}-1$), and in the last pass before the desired count is reached, stop counting at $TERM\_CNT_{10}$[m−1:0], and bit m of TERM_CNT (TERM_CNT[m]) is "0" at that point. The number of times CNT[m:0] counts from 0 to ($2^{m+1}-1$) is equal to ($2^{n-m-1}$)−1.

In inventive counter 30, these same $CNT_{30}$ signal bits start from their initial value ($2^m$−TERM_$CNT_{30}$ [m:0]), count up to $2^m$, then repeatedly count up from $2^m$ to ($2^{m+1}-1$), count back down to 0, then count up to $2^m$. In inventive counter 30, counting stops when all bits of $CNT_{30}$ [n−1:m+1] are logical "1", and $CNT_{30}$[m:0] is $2^m$. For counter 30, the number of times $CNT_{30}$[m:0] passes through this loop is given by the expression ($2^{n-m-1}$)−1, which is also the number of times counter 10 $CNT_{10}$[m:0] is equal to ($2^{m+1}-1$).

The operation of counter 10 and counter 30 relative to $CNT_{30}$[m:0] and $CNT_{30}$[m:0], respectively, is now described in greater detail relative to the counting example illustrated in FIG. 10 which provides an exemplary comparison of CNT[m:0] conventional counter 10 and an embodiment of the inventive counter 30. Counter 10 starts by passing through the 0-to-($2^{m+1}-1$)-to-0 loop three times (see Segments A–C in FIG. 10), and finally counts from 0 up to TERM_CNT[m:0] and jumps back to 0 (FIG. 10, Segment D). Counter 30 counts up from ($2^m$−TERM_CNT [m:0]) to $2^m$ (Segment E), passes through the $2^m$-to-($2^{m+1}-1$)-to-0-to-$2^m$ loop three times (Segments F, G, H), and finally jumps back to ($2^m$−TERM_CNT[m:0]) (Segment I). Although the loops are traversed only three times in this example, it should be clear from this description that the example can be extended by inserting additional loops to the operation of either counter 10 or counter 30. It should also be clear that in the lightly shaded areas of the chart of FIG. 10 (that is for regions or segments A2–A3, B1–B3, C1–C3, F1–F3, G1–G3, and H1–H2) each of counter 10 and counter 30 have exactly the same toggle patterns, and that the toggle patterns are also the same in the darker shaded areas (areas A1 and H3). Therefore, only the different toggle patterns in areas E1–E2, I1, or D1–D3 could potentially result in different toggle counts overall for counters 10 and 30.

In order to understand the difference between counter 10 and counter 30 relative to the number of toggles further, we first observe that for CNT[m−1:0] all values from ($2^m$−TERM_CNT[m:0]) to ($2^m$−1) are 1's complements of numbers from (TERM_$_{CNT[m]}$,0])−1) to 0. We next observe that CNT[m] is always 0 for all counts in both ranges. We also observe thirdly that bit inversion changes only the polarities of the toggles (that is, 0-to-1 becomes 1-to-0 and vice versa). Finally we observe that traversing a range from the opposite direction (for example counting down rather than counting up) only reverses polarities of toggles, but not the number of toggles. These observations are further illustrated by the information in FIG. 11.

Combining the above four observations, one readily concludes on the basis of the forgoing description that in counting from 0 to (TERM_CNT[m:0]−1), as illustrated relative to segment D1, has the same number of toggles as counting from ($2^m$−TERM_CNT[m:0]) to ($2^m$−1), as illustrated relative to segment E1. In FIG. 11 it is shown how counter 30 counts from the last row up, opposite of counter 10, to better illustrate the 1's complement relationship. When counter 10 counts up from 0 (the start value) to 4 (the end value), it experiences 7 bit toggles, the same number of bit toggles experienced by counter 30 in counting from 3 (the start value) to 7 (the end value).

These results suggest that any differences between counter 10's toggle count and counter 30's toggle count can only stem from the transitions of counter 30 from ($2^m$−1) to$2^m$ (see segment E2) and from $2^m$ to [$2^m$−TERM_CNT [m:0]] (see segment I1) and the transitions of counter 10 from (TERM_CNT[m:0]−1) to TERM_CNT[in:0] (see segment D2) and from TERM_CNT[m:0]) to 0 (see segment D3).

In the worst case comparison of counter 30 relative to counter 10 occurs when TERM_$_{CNT[m]}$,0] is 1, that is when TERM_CNT[m:0] has a "000 . . . 001" bit pattern. In this situation, the transition of counter 10 from (TERM_CNT [m:0]−1) to TERM_CNT[m:0] becomes 000 . . . 0 to 000 . . . 1 with only one toggle, and the transition from TERM_CNT[m:0] to 0 becomes 000 . . . 1 to 000 . . . 0, again with only a single toggle. The three dots (ellipsis) in the bit pattern indicates bits for which bit values are the same as the values of the bits immediately before the ellipsis. In the same situation the transition of counter 30 from ($2^m$−1) to $2^m$ becomes 011 . . . 1 to 100 . . . 0 with m+1 toggles, and the transition from $2^m$ to ($2^{m-TERM}$_CNT[m:0]) becomes 100 . . . 0 to 011 . . . 1, also with m+1 toggles. This leaves counter 30 with $2^m$ more toggles than counter 10 in this worst case situation. However, even in this worst case situation the difference is often negligible because its contribution is so small. Generally, the inventive counter 30 will consume less power, or a negligibly greater amount of power than conventional counter 10. We now consider the magnitude of the additional $2^m$ toggles that counter 30 may experience in its worst case situation.

Let TI (i) be the number of toggles counter 10's CNT[i] signal has while counting from 0 to TERM_CNT, TO (i) be the number of toggles counter 10's CNT[i] signal has while jumping from TERM_CNT back to 0, and T be the number of toggles counter 10's CNT[n:0] has while counting from 0 to TERM_CNT and back to 0. Using this notation it follows that:

$$TI(i) = \left\lfloor \frac{TERM\_CNT}{2^i} \right\rfloor$$

$$TO(i) = \begin{cases} 0, \text{ if } TI(i) \text{ is even} \\ 1, \text{ if } TI(i) \text{ is odd.} \end{cases}$$

$$T = \sum_{i=0}^{n-1} (TI(i)) + TO(i), n = \text{width of TERM\_CNT}$$

Because TERM_CNT increases exponentially as n, TI (i) decreases exponentially with i, 2m increases linearly as m, and m is always less than n, it follows that when n is sufficiently large, 2m is a very small percentage of T. The table in FIG. 12 lists the cases for n between 3 and 8. It is noted that when n=8, 2m is less than 5% of T. The value of 2m as a percentage of T decreases further as n increases.

Now it's established that the toggle rate of CNT in both counters are approximately the same, it is also clear that the following pairs should be roughly equal: $P_{11}$ and $P_{31}$, $P_{14}$ and $P_{34}$, $P_{15}$ and $P_{35}$, $P_{14c}$ and $P_{34c}$, $P_{15c}$ and $P_{35c}$.

Now there are only two pairs left to compare: $P_{13}$ and $P_{33}$, $P_{11c}$ and $P_{31c}$. In these two pairs $P_{31c}$ and $P_{33}$ can be significantly less than their counterparts when n is sufficiently large. Two portions of $P_{11c}$, comparator A input capacitance and wire capacitance to the comparator, are reduced when fewer bits are used by the comparator. This change reduces C in the power formula. Even if the overall load isn't reduced, the loads of the least significant bits of CNT, which have the highest toggle rates, are moved to signals with lower toggle rates, thus reducing f in the power formula. Furthermore, this power saving may be amplified when TERM_CNT is programmable. Variable TERM_CNT makes it desirable that comparator 13 be a general-purpose comparator, which often has many internal signals that toggles along with inputs, even when the output does not change.

Selected Counter Numerical Comparison Examples

With further reference to Examples 1–3 in FIG. 4 already discussed, we now provide some selected exemplary illustrative numerical comparisons for each example scenario involving fixed and variable TERM_CNT, and different start and end values (conventional and new). As with the power conservation analysis and its seven simplifying assumptions, these numerical comparisons are intended to validate and illustrate the nature of power saving or power conservation achievable and are not intended as rigorous mathematical derivations or proofs. The inventive structure and method are not to be limited in any way by exemplary embodiments of the counters or counting methods illustrated in these examples, nor is the invention to be limited to the particular power or energy savings described in these illustrative examples.

EXAMPLE 1

Terminal Count Shifted From 136 to 192

TERM_CNT in this example is 136, or 10001000 in binary. The third and seventh bits (starting with bit number 0, e.g. TERM_CNT[0]) of TERM_CNT, that is TERM_CNT[7] and TERM_CNT[3], are both 1. In conventional counter 10, because the terminal count value is fixed, a two-input AND gate connected to CNT[3] and CNT[7] is adequate as the comparator 13. Typically an AND gate consumes no power until its output toggles, thus $P_{13}$ in counter 10 in this case is nearly 0.

In the inventive counter 30, the count start value is shifted from 0 to 56, and the count end value is shifted from 136 to 192 (11000000 in binary). The same two-input AND gate is used as the comparator 33, but the bit to check is moved from CNT[3] to CNT[6]. Even though this change only moves some capacitance to a different signal, the toggle rate associated with the capacitance is reduced from 18 toggles down to 4 toggles, a reduction of about 4.5 times from the frequency at which the capacitance is switched in counter 10. Since the power consumed is directly proportional to the capacitance and/or frequency (recall $P=kCV^2f$), a 4.5 time reduction in capacitance or frequency at which the capacitance is switched for this component translates into a 4.5 times reduction in power consumed by this component for counter 30. This represents a modest improvement achieved by moving capacitance from one signal to another signal having a lower toggle rate. Even greater improvements may be realized for other counting scenarios.

EXAMPLE 2

Terminal Count Shifted From 150 to 192

The toggle rate reduction and the resulting reduction in power consumption realized in the scenario of Example 1 useful but not spectacular. For the Example 2 scenario, power consumption is lessened by reducing both toggle rate and capacitance. The terminal count value is 150, or 10010110 in binary. Again, an AND gate or function is used to generate TC, but a 4-input gate is used rather than the 2-input AND gate used for Example 1. The CNT signal bits CNT[7], CNT[4], CNT[2], and CNT[1] are connected to the AND gate, while CNT[8], CNT[6], CNT[5], and CNT[3] need not be checked. In this example, the toggle rate of CNT[7], CNT[4], CNT[2], and CNT[1] are 2, 10, 38, and 76 respectively.

After the inventive method technique is applied, the count range shifts from the 0–150 range to the 42–192 range. The comparisons are made on 192 (binary 11000000) rather than (10010110), so only a two-input AND gate is needed to compare the "1" bits in 192 are needed (rather than the 4-input AND gate needed for 150 in the conventional counter 10). This reduces the capacitance of wires to the AND gate in and the loads of the AND gate counter 30 by 50% compared to counter 10. Furthermore, because the more significant bit CNT[6] now replaces lower significant bits CNT[4], CNT[2], and CNT[1], the toggle count is reduced from a total of 126 down to 6, a factor of about 20 times. In both counter 10 and counter 30, the bit CNT[7] is input to the AND gate.

EXAMPLE 3

Variable Terminal Count Value

Example 3 has a variable TERM_CNT, ranging from decimal 48 ( 00110000 in binary) to 346 (101011010 in binary) for conventional counter 10. Since for conventional counter 10, all numbers in this range must be covered as possible count end values, a general purpose comparator, rather than the AND gate usable with the inventive counter, must be attached to all bits of CNT in counter 10. In the inventive counter only selected bits need be checked. (We note that any number or count can be checked or compared, however, in general there may be some special cases for which the inventive counter will operate properly but for which power or energy consumption may be the same or even greater than conventional implementations.) The overall toggle count or rate depends on TERM_CNT, but in the best case (TERM_CNT is 48) the overall toggle count is 96, and in the worst case (TERM_CNT is 346) the overall toggle count is 692. In addition to CNT, some internal signals of the comparator 13 will toggle when CNT toggles, so that the comparator 13 consumes additional power.

By comparison, using the inventive counter structure and method, the new count end value is set to 384 (110000000) and the new count start value is set from 336 (101010000) down to 38 (000100110), and only a two-input AND gate is needed to test CNT[8] and CNT[8] to determine if NCEV is 384, or 110000000 in binary, and generate TC.

This change reduces the capacitance associated with the comparator 33 by more than 75% as compared to comparator 13 in counter 10. The toggle count is drastically reduced as well. In the best case, CNT[8] and CNT[7] toggle only twice, and in the worst case thee two toggle only six times. Finally, the elimination of the general-purpose comparator 13 with the two input AND gates as the effective comparator 33 in counter 30 saves all power consumed by any signal toggles that occur inside comparator 13 but do not affect the comparator output.

One embodiment of the inventive counter 30 and counting method having been described in detail, with supporting exemplary numerical comparison data, we now describe another embodiment of counter structures that embody the inventive principle. This alternative embodiment result in significant power savings. Detail analysis of power and toggle pattern are not provided for this embodiment as a comparable analysis to that already provided respective of counter 30 may be performed by those workers having ordinary skill in the art in light of the description already provided herein.

Figure 14:
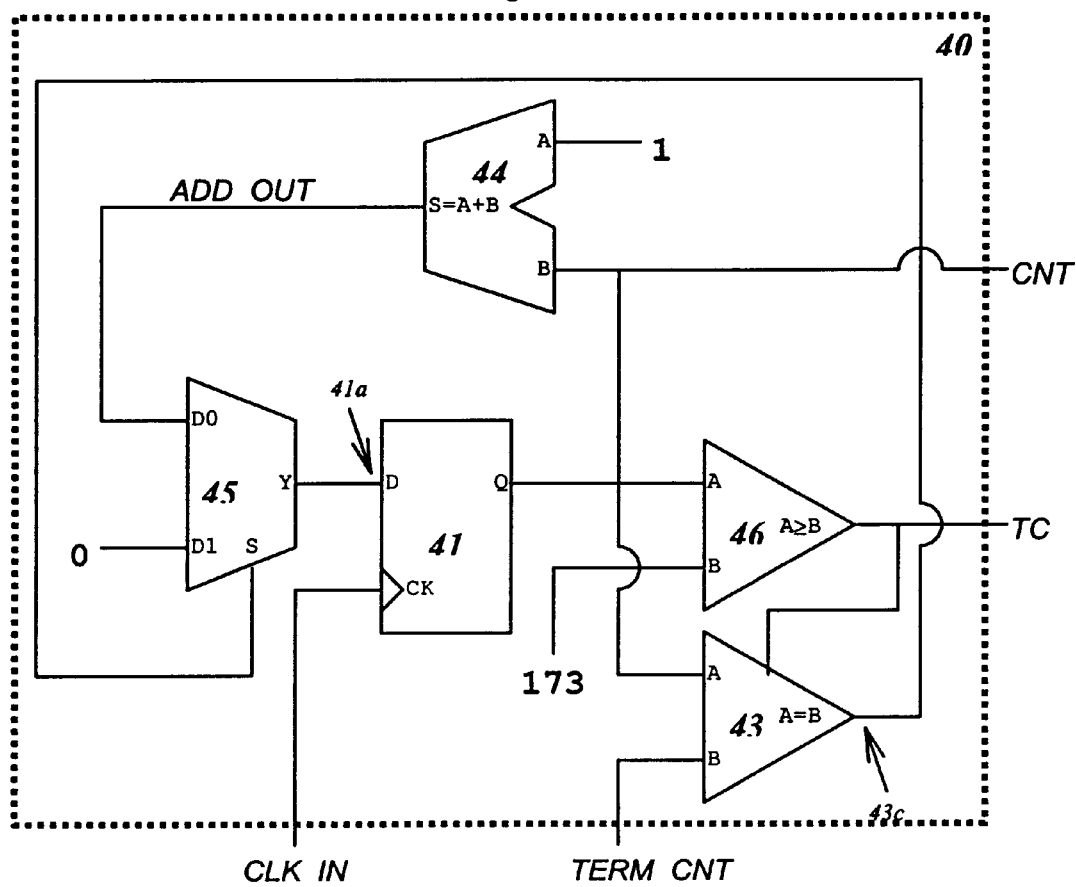
FIG. 14 shows an other conventional digital counter circuit.

With respect to FIG. 13 which identifies an Example 4 scenario of requirements, and conventional and inventive count start values and count end values, we now describe a conventional circuit embodiment of counter 40 shown in FIG. 14. Here, the TC is stretched such that TC starts when CNT is 173, and ends when CNT reaches a programmable value between 175 and 180. Structurally, Counter 40 provides a second "larger-than-or-equal-to" comparator 46. Comparator 43 (corresponding generally to comparator 13 of counter 10) compares CNT (input "A") with the programmable TERM_CNT (input "B" ), while the added "larger-than-or-equal-to" comparator 46 compares CNT (input "A") with a fixed value 173 (input "B").

The new comparator 46 can be constructed from combinational logic, and the original comparator 43 can be reduced to a 5-bit equality comparator that uses TC, and the signal CNT need not be connected to this 5-bit comparator. One potential disadvantage of the embodiment of the conventional counter 40 structure is that comparator 46 must still be connected to bits of CNT that have high toggle rates, which will cause undesired internal toggles. These internal toggles may even appear as signal glitches at TC and cause unwanted toggles in first comparator 43 or circuits controlled by TC.

Figure 15:
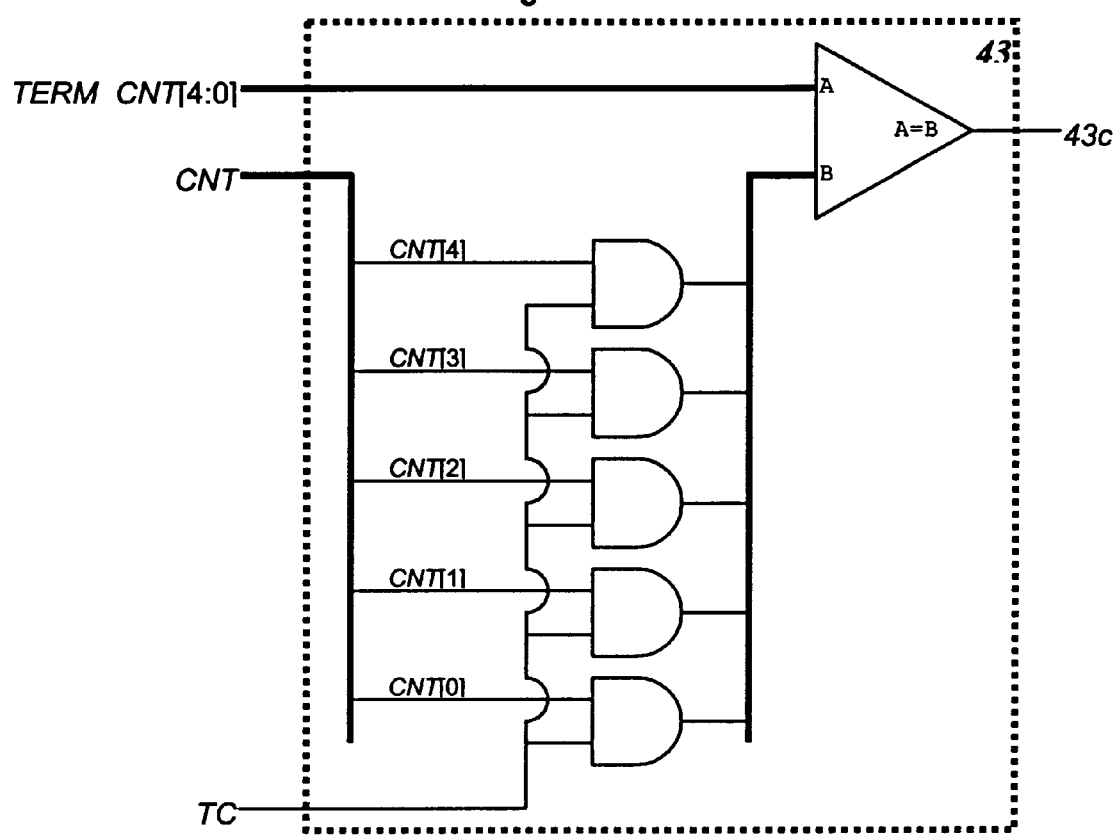
FIG. 15 shows an exemplary equality comparator having five AND gates that may be used with the counter of FIG. 14.
Figure 16:
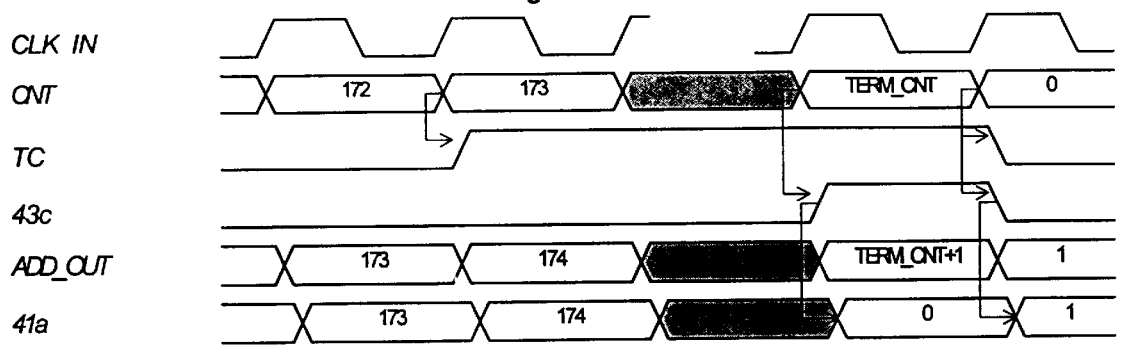
FIG. 16 shows a timing diagram for selected signals of the counter circuit in FIG. 14 around the activation of TC.

An exemplary equality comparator 43 for use with counter 40 and having five AND gates is illustrated in FIG. 15. A signal timing diagram, analogous to that already shown and described for the counter 10 circuit is provided in FIG. 16 which shows the signal timing diagram of counter 40 around the activation of TC.

Figure 17:
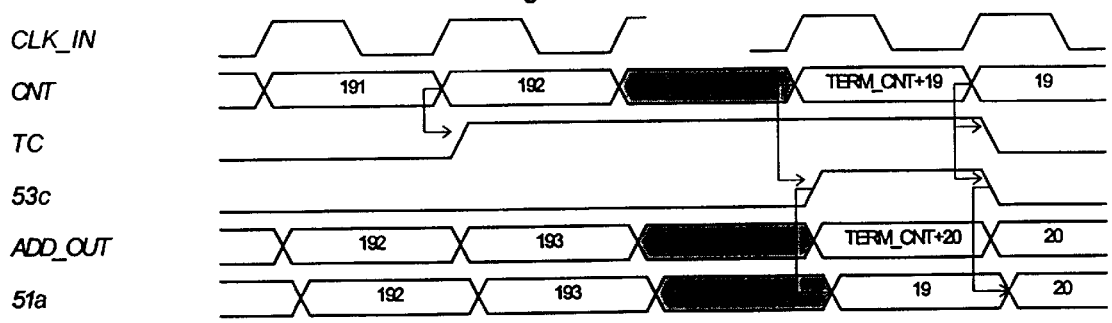
FIG. 17 shows another embodiment of the inventive digital counter circuit.

A second embodiment of the inventive counter 50 structure and method which eliminates some problems of conventional counter 40 are now described relative to the embodiment in FIG. 17. Unlike counter 30, which would make the initial CNT value variable and last CNT 192, counter 50 assigns value 19 to the initial CNT value, and lets the last CNT value be variable from 194 to 199. This change moves the TC start point to 192, making the "larger-than-or-equal-to" comparator 56 a two-input AND gate, connected to only the most significant, least toggled two bits of CNT. The change also takes advantage of the fact that value 180 is only 7 values away from the final value 173, and reduces the equality comparator 53 to three-bits wide, requiring two fewer AND gates for isolation and further reducing power or energy consumption.

Figure 18:
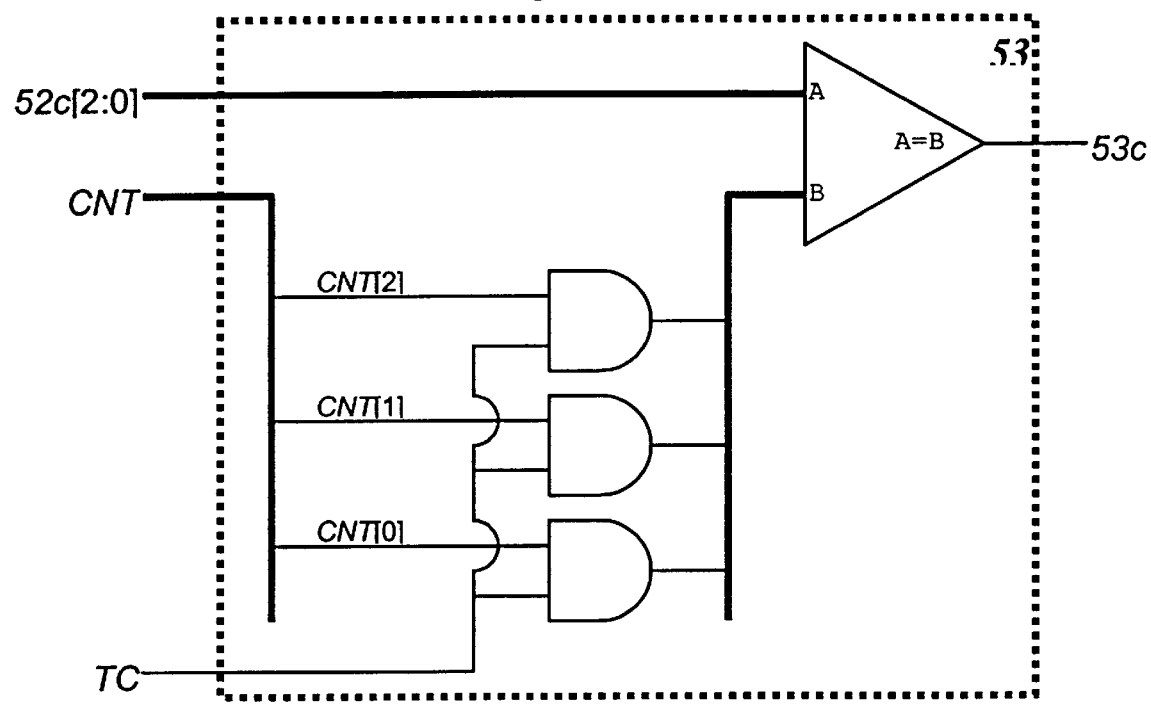
FIG. 18 shows an exemplary embodiment of another equality comparator having three AND gates that may be used with the inventive counter of FIG. 17.
Figure 19:
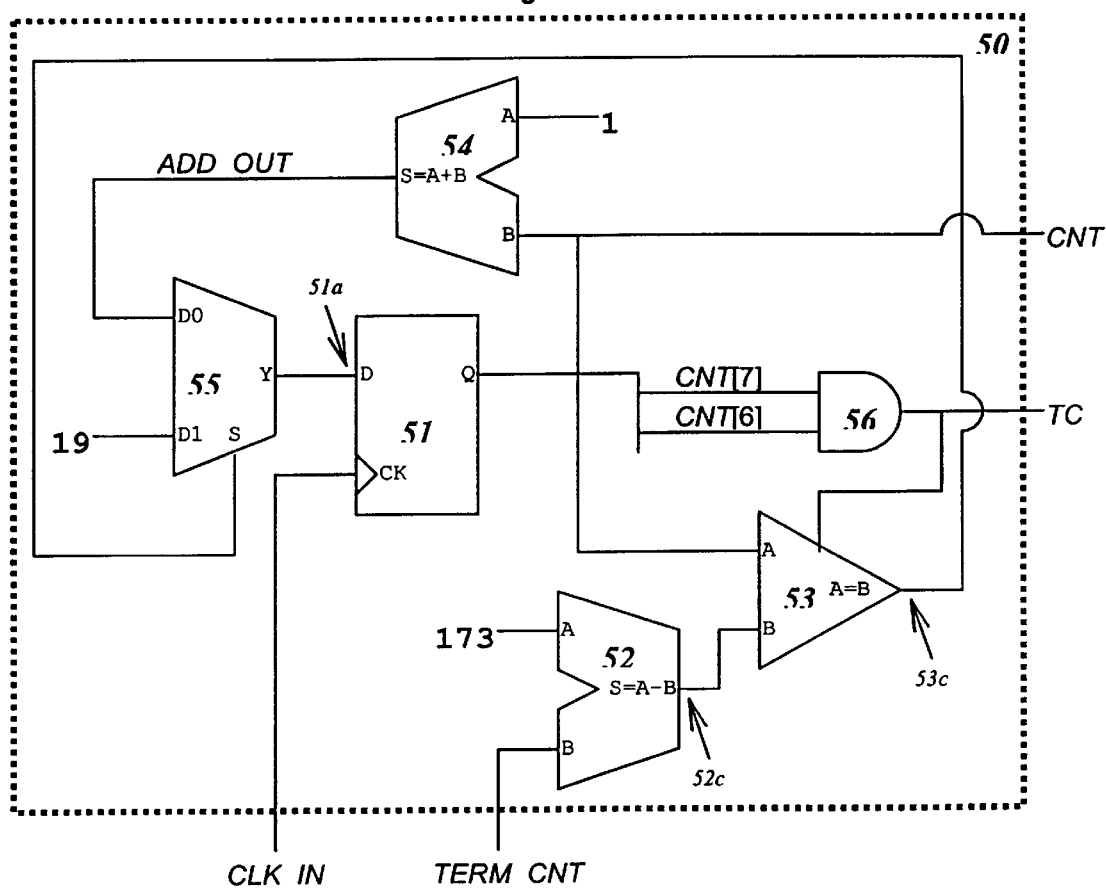
FIG. 19 shows a timing diagram for selected signals of the counter circuit in FIG. 17 around the activation of TC.

An exemplary embodiment of equality comparator 53 and the three AND gates as illustrated in FIG. 18. FIG. 19 shows the timing diagram of counter 50 around the activation of TC.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in logic circuit or block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

All publications and patent applications mentioned in this specification are herein incorporated by reference to the same extent as if each individual publication or patent application was specifically and individually indicated to be incorporated by reference.

I claim:

1. A method for counting a predetermined number of counts, said method comprising:

identifying a count end value which is greater than or equal to said predetermined number of counts, said count end value being representable by n symbols designated n−1, n−2, . . . , m, m−1, . . . , 1, 0, where the most significant n−1 through m symbols are a first binary symbol and the least significant m−1 through 0 symbols are a different second binary symbol;

initializing an n-symbol current count value representable by n−1, n−2, . . . , m, m1, . . . , 10, symbols at a count start value which is equal to said count end value minus said predetermined number of counts;

incrementing said current count value by one value for each count;

comparing, after said current count value incrementing, each of said n−1, . . . , m symbols with said first binary symbol; and generating a count completed indicator when each of said n−1, . . . , m current count symbols are said first binary symbol without regard to the state of said m−1, . . . , 0 current count symbols.

2. A method according to claim 1, wherein said first binary symbol is "1" and said second binary symbol is "0".

3. A method according to claim 2, wherein said count end value is identified from the expression:

$$NCEV = \sum_{i=m}^{n-1} 2^i$$

where n is number of binary symbols required to represent said count end value, m is the symbol location of the least significant "1" bit, and i is the index of summation.

4. A method according to claim 3, wherein said count end value is identified from the expression:

$$NCEV = \sum_{i=m}^{n-1} 2^i$$

where n is given by the expression $n=\lfloor \log_2 \text{TERM\_CNT}_{max} \rfloor + 1$, m is given by the expression $m=\lfloor \log_2(2^n - \text{TERM-CNT}_{max}) \rfloor$, $\text{TERM\_CNT}_{max}$ is the maximum count the counter will ever need to count, and i is the index of summation.

5. A method according to claim 2, wherein the number of changes in state of said n bits is the minimum number of bit changes to transition from said initialized current count value to said end count value.

6. In an electronic digital counter circuit, a method for counting a predetermined number of counts, said method comprising:

identifying an end value which is greater than or equal to said predetermined number of counts, said end value being representable by an n binary symbols where the most significant n−1 through m of said symbols are "1" and the least significant m−1 through 0 binary symbols are "0";

incrementing a current value from an initial value by one value for each count of said digital counter; and generating a count completed indication when on a bit-by-bit basis the most significant n−1, . . . , m bits of said current value are "1" without regard for the bit state of said m−1, . . . , 0 bits.

7. In an electronic digital counter circuit, a method for counting over a total count range of k integer values comprising:

identifying an integer new count end value NCEV having a numerical value greater than or equal to said total count range k and having a binary n-bit representation wherein said NCEV has fewer logic "1" bits than the number of logic "1" bits in the binary representation for k;

monitoring clock pulses driving said digital counter to count;

determining if a terminal count value has been reached (TC=1) and if it has not been reached, then setting the counter output (CNT) equal to the output of an adder which increments the counter for each clock pulse received, and otherwise resetting the counter output (CNT) equal to the difference of the NCEV minus TERM_CNT;

comparing the predetermined valued of NCEV with the current counter output (CNT) and if they are equal, then setting the terminal count (TC) equal to "1", and otherwise setting the terminal count (TC) equal to "0";

incrementing the CNT signal by 1 (CNT+1) for each count of said counter; and setting the output of the adder (ADD_OUT) equal to the incremented CNT+1 value.

8. An electronic digital counter comprising:

a subtractor circuit receiving an end count signal (NCEV) and a terminal count signal (TERM_CNT) and generating a remainder signal equal to the end count signal minus the terminal count signal;

an n-bit two-input one-output multiplexer circuit coupled to receive said remainder signal at a first input terminal and a second input (ADD_OUT) at a second input terminal and generate a multiplexer output signal;

an n-bit adder circuit generating said second input (ADD_OUT) as the sum of a count signal (CNT) and a counter increment value;

an n-bit flip-flop array receiving a clock signal (CLK_IN) at a clock signal input terminal (CK) and said multiplexer output signal at a data terminal to generate an flip-flop output signal at a flip-flop output terminal; and a comparator circuit receiving said flip-flop output signal and comparing selected bits of said flip-flop output signal to determine when all of said selected bits have the same predetermined binary value.

9. An electronic counter according to claim 8, wherein said selected bits consist of the n−1 through m bits of said count signal (CNT) and said comparator circuit comprises an n−1−m input AND gate.

* * * * *